United States Patent [19]
Omid-Zohoor

[11] Patent Number: 6,097,072
[45] Date of Patent: Aug. 1, 2000

[54] TRENCH ISOLATION WITH SUPPRESSED PARASITIC EDGE TRANSISTORS

[75] Inventor: Farrokh Omid-Zohoor, Sunnyvale, Calif.

[73] Assignee: Advanced Micro Devices, Sunnyvale, Calif.

[21] Appl. No.: 09/081,386

[22] Filed: May 16, 1998

Related U.S. Application Data

[63] Continuation of application No. 08/623,639, Mar. 28, 1996, abandoned.

[51] Int. Cl.$^7$ ................................................. H01L 29/76
[52] U.S. Cl. .......................... 257/397; 257/510; 257/513
[58] Field of Search ...................................... 257/397, 510, 257/513, 514, 515, 395, 396; 438/424, 427, 428, 435, 453

[56] References Cited

U.S. PATENT DOCUMENTS

| | | | |
|---|---|---|---|
| 4,463,491 | 8/1984 | Goldman et al. | 29/571 |
| 4,497,108 | 2/1985 | Kurosawa . | |
| 4,509,249 | 4/1985 | Goto et al. | 29/576 W |
| 4,905,065 | 2/1990 | Selcuk et al. . | |
| 5,208,179 | 5/1993 | Okazawa . | |
| 5,445,989 | 8/1995 | Lur et al. . | |
| 5,445,990 | 8/1995 | Yook et al. . | |
| 5,457,339 | 10/1995 | Komori et al. . | |
| 5,459,096 | 10/1995 | Venkatesan et al. . | |
| 5,460,998 | 10/1995 | Liu . | |
| 5,466,623 | 11/1995 | Shimizu et al. . | |
| 5,468,675 | 11/1995 | Kaigawa . | |
| 5,468,676 | 11/1995 | Madan . | |
| 5,470,783 | 11/1995 | Chiu et al. . | |
| 5,472,904 | 12/1995 | Figura et al. . | |
| 5,472,905 | 12/1995 | Paek et al. . | |
| 5,472,906 | 12/1995 | Shimizu et al. . | |
| 5,473,186 | 12/1995 | Morita . | |
| 5,474,953 | 12/1995 | Shimizu et al. . | |
| 5,498,891 | 3/1996 | Sato . | |

FOREIGN PATENT DOCUMENTS 0 080 731 A2   11/1982   European Pat. Off. .

OTHER PUBLICATIONS

Fuse, et al. "A New Isolation Method with Boron–Implanted Sidewalls for Controlling Narrow–Width Effect", IEEE, 1987.

Sawada et al. "Electrical Properties for MOS LSI's Fabricated Using Stacked Oxide SWAMI Technology", IEEE, 1985.

"2.6 Non–Locos Isolation Technologies, I: (Trench Etch and Refill)", Silicon Processing for the VLSI Era—vol. II, pp. 45–58.

*Primary Examiner*—Sara Crane
*Attorney, Agent, or Firm*—Foley & Lardner

[57] ABSTRACT

An integrated circuit device includes a substrate having a planar surface and isolating trenches etched from the substrate. The isolating trenches form edges and corners with the surface of the substrate. An oxide covers the surface and fills the isolating trenches. The oxide has a thickness at the edges and corners which is greater than its thickness in other areas of the surface of the substrate. Field effect transistors having gate electrodes disposed on the oxide over the edges and corners and over a portion of the other areas of the surface are formed. Formation of parasitic edge transistors is suppressed and thinning of the oxide at the trench edges and corners is prevented because the oxide at the edges and corners is raised with respect to the other areas of the surface, thereby elevating the gate electrode at the edge and corner.

10 Claims, 8 Drawing Sheets

TRENCH ISOLATION WITH SUPPRESSED PARASITIC EDGE TRANSISTORS

This application is a continuation of Ser. No. 08/623,639 filed Mar. 28, 1996, now abandoned.

BACKGROUND OF THE INVENTION

1. Field of the invention

The invention relates generally to trench isolation, and more particularly, to a method of suppressing formation of parasitic edge transistors and preventing the thinning of gate oxide at edges of a field effect transistor and an isolating trench of an integrated circuit device and to the resulting integrated circuit device.

2. Related Art

Various methods have been developed to isolate devices within integrated circuits. One of the methods is known as trench etch and refill. In this method, a trench is etched into a substrate and is filled with a chemical vapor deposition (CVD) oxide. With respect to devices with submicron gate widths, the etched trenches may be shallow (depth<1 $\mu$m), of moderate depth (1 $\mu$m≦depth≦3 $\mu$m), or deep and narrow (depth>3 $\mu$m and width<2 $\mu$m). Deep and narrow trenches refilled with CVD oxide are particularly useful for preventing latchup and for isolating n-channel from p-channel devices in CMOS circuits.

Fabrication of trenches, however produces parasitic edge transistors at the edges and corners of the trench sidewalls. Parasitic edge transistors are not desired because they increase the OFF current of the devices of the integrated circuit. Parasitic edge transistors also turn on at a lower voltage than the active device, thereby causing a phenomenon known as a "subthreshold kink" in the current-voltage (I-V) characteristic curve.

Figure 1:
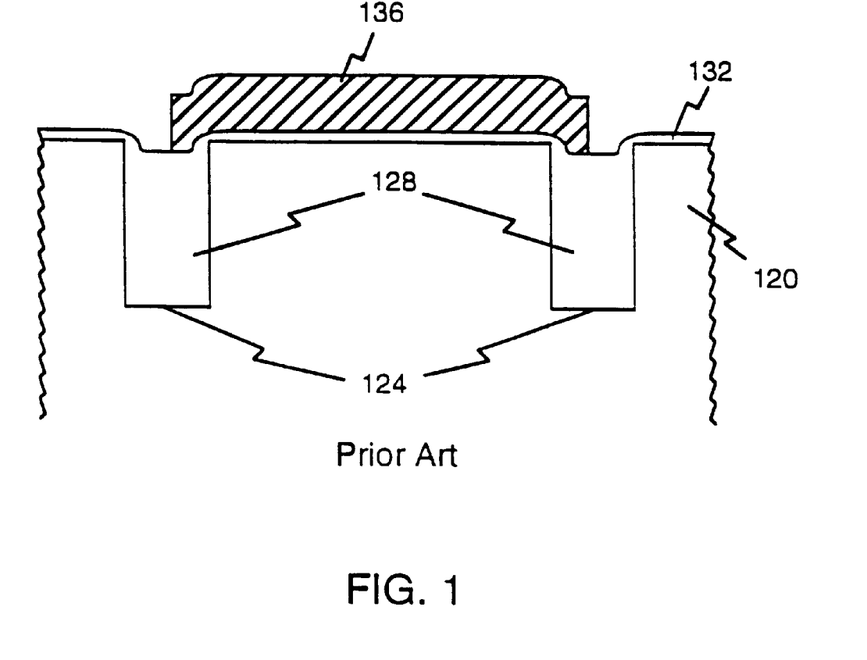
FIG. 1 shows a cross-section of a conventional integrated circuit device utilizing deep and narrow trench isolation.

FIG. 1 shows a conventional deep-and-narrow isolation trench structure. A silicon substrate 120 is formed with trenches 124. Trenches 124 are filled with an oxide 128 to isolate active devices from each other. A gate oxide 132 covers the substrate 120 and the oxide 128 in the trenches 124. A gate polysilicon (poly) electrode 136 is on top of the gate oxide 132 and positioned over the substrate 120 to form an active device with the ends of the gate poly electrode 136 extending over a portion of the trenches 124.

The oxide 128 is formed with dimples in the trenches 124. The dimples are caused by overetching of a sacrificial oxide (sacox) prior to forming the gate oxide 132. When the gate oxide 132 and the gate poly electrode 136 are added, they recess partially into the trenches 124.

The conventional structure, as shown in FIG. 1, forms parasitic edge transistors at the edges and corners of the trenches 124. The recessed portion of the gate poly electrode 136 acts as a gate electrode of the parasitic transistor and the portion of the gate oxide between the recessed portion and the side wall of the trench 124 acts as a gate oxide of the parasitic transistor.

Further problems occur due to a thinning of the gate oxide 132 at the edges and corners of the trenches 124 where the gate oxide 132 recesses into the trenches 124. Thinned gate oxide decreases reliability and increases the electric field strength at the trench corner and sidewalls, thereby exacerbating the above discussed problem regarding parasitic transistors.

SUMMARY OF THE INVENTION

It is an object of the invention to overcome the above and other problems in the prior art. Specifically, it is an object of the invention to provide an integrated circuit device which suppresses formation of the parasitic edge transistors and prevents the thinning of the gate oxide at the edges and corners of isolation trenches.

Another object of the invention is to reduce the electric field between the gate electrode and the substrate around the isolation trench corner.

Still another object of the invention is to shut off any parasitic edge transistor that may be formed at the edges and corners of isolation trenches.

Still another object of the invention is to improve the gate oxide quality.

Yet another object of the invention is to eliminate the subthreshold kink in the I-V characteristic curve of an integrated circuit.

Still another object of the invention is to reduce the OFF current and thereby reduce the subthreshold slope of an integrated circuit.

The above and other objects of the invention are accomplished with an integrated circuit device which prevents the gate electrode from recessing into the isolation trenches. In the integrated circuit device according to the invention, isolating trenches are first formed in a semiconductor body. Each of the isolating trenches are overfilled with an insulating material to a top level above a planar surface level of the semiconductor body. Field effect transistors are formed at the surface of and in the semiconductor body, each field effect transistors being formed with a thin gate insulator whose lower surface is on the semiconductor body and whose upper surface is in contact with a lower surface of a gate electrode. Both the thin gate insulator and the gate electrode have common ends adjacent one of the isolating trenches, the upper surface of the thin gate insulator end being below the overfilled top level of the insulating material and the lower surface of the end of the gate electrode being in contact with the overfilled top level of the insulating material so as to suppress parasitic transistor formation.

For example, in an integrated circuit device according to the invention, an oxide covers the planar surface and fills the isolating trench. The oxide has a thickness at the edges and corners of the isolating trench which is greater than a thickness of the oxide in other areas of the planar surface. A field effect transistor can be formed by disposing a gate electrode on the oxide over the corner and edge and over other areas of the planar surface which define the active device area. The thickness of the oxide at the edges and corners prevents the gate electrode from recessing into the isolating trench. In one preferred embodiment of the invention, the oxide at the corner and edge is raised with respect to the active device area, thereby elevating the gate electrode at the corner and edge.

According to the invention, a method of suppressing formation of parasitic edge transistors and preventing the thinning of gate insulating material at edges of a field effect transistor and an isolating trench of an integrated circuit device formed in and on a semiconductor body with a planar surface includes a first step of forming an isolating trench by overfilling a vertical trench opening in the semiconductor body with insulating material to a top level above the planar surface. Next, gate insulating material is formed on the surface of the semiconductor body of a thickness less than the top level of the insulating material of the trench. The next step includes forming a gate electrode on the gate insulating material and on a portion of the insulating material of the trench.

Additional objects and advantages of the invention will be set forth in the description which follows. The objects and advantages of the invention may be realized and obtained by means of the instrumentalities and combinations particularly pointed out in the appended claims.

BRIEF DESCRIPTION OF THE DRAWINGS

The invention is described in detail herein with reference to the drawings in which.

DETAILED DESCRIPTION OF THE PREFERRED EMBODIMENTS

Figure 2:
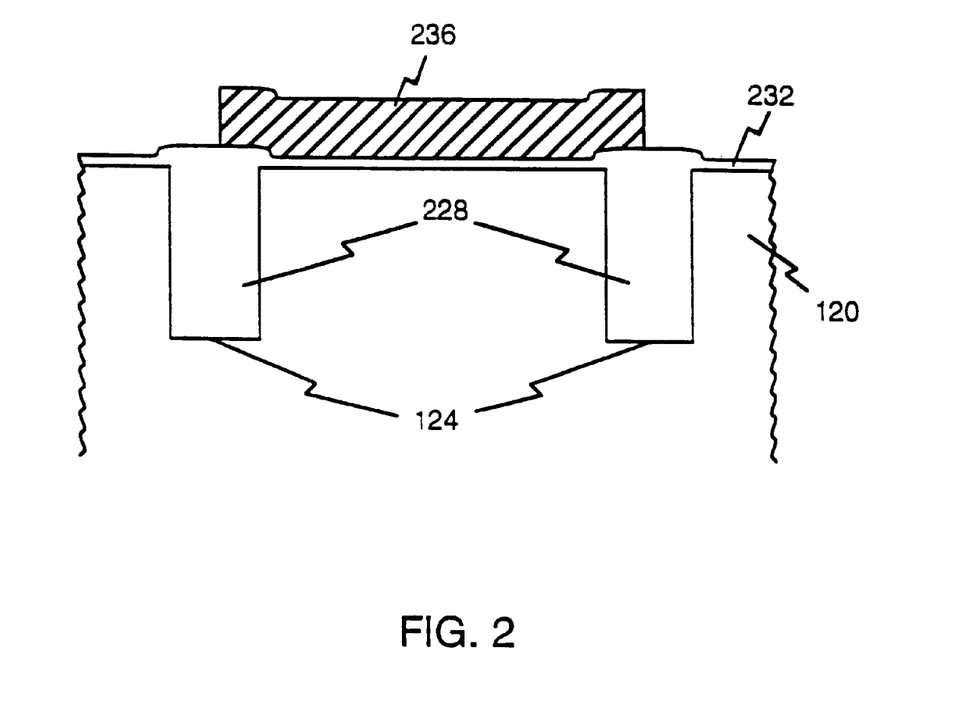
FIG. 2 shows a cross-section of an integrated circuit device according to the invention.

FIG. 2 shows an integrated circuit device according to the invention. A substrate 120 is formed with trenches 124. The trenches 124 form corners with the surface of the substrate 120. Substrate 120 may be a semiconductor body such as a silicon wafer. An insulating material 232 covers the substrate 120 and fills the trenches 124, thereby isolating active devices formed in and on substrate 120 from each other. The insulating material 232 may be an oxide such as silicon oxide ($SiO_2$). An electrode 236 is disposed on the insulating material 232. As is shown in FIG. 2, the electrode 236 is positioned between trenches 124 with a portion of each end of electrode 236 extending past the trench corners and over the trenches 124.

The trenches 124 are overfilled with the insulating material 232 to a top level above a planar surface of the substrate 120. In the embodiment shown in FIG. 2, the thickness of the insulating material at the edges and corners of the trenches and over the region directly above the trenches is thicker than the thickness of the oxide at other areas of the surface of the substrate. In other words, the insulating material 232 forms a hump over the trenches 124.

According to the invention, the insulating material 232 prevents the electrode 236 from recessing into the trench 124 around the trench edges and corners. Because the ends of the electrode 236 are elevated at the trench edges and corners, formation of the parasitic edge transistors is suppressed. The structure illustrated in FIG. 2 provides the further advantage of preventing the thinning of the insulating material 232 at the trench edges and corners. Thus, the reliability of the insulating material is improved and the electric field strength produced at the trench edges and corners is reduced. The reduction in electric field strength also contributes to suppressing the formation of parasitic edge transistors.

A further advantage is provided by the integrated circuit device according to the invention by eliminating the kink in the subthreshold I-V characteristic curve. Any parasitic edge transistor formed at the trench edges and corners is effectively either suppressed or shut off. By elevating the electrode 236 at the trench edges and corners, a parasitic edge transistor formed at the corner or edge would have a threshold voltage greater than the threshold voltage of the intrinsic transistor's respective active device. Because the active device will turn on before the parasitic transistor, the subthreshold characteristics of the active device are not affected by the parasitic transistor. Therefore, a kink would not be exhibited in the active device's subthreshold $I_D$-$V_G$ characteristic curve.

Figure 3A:
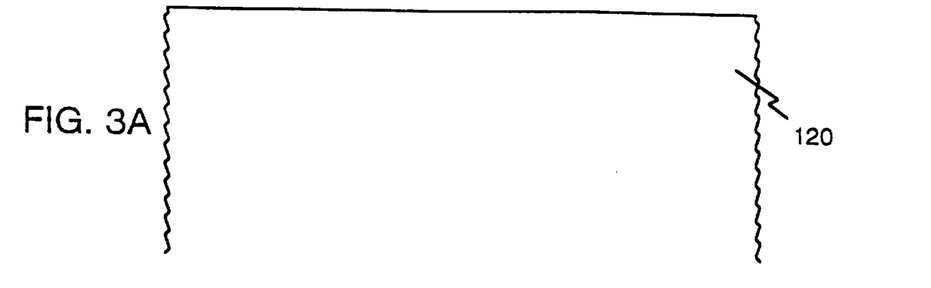
FIGS. 3A–3Q show method steps for suppressing formation of parasitic edge transistors and preventing the thinning of gate oxide at isolation trench edges and corners.
Figure 3B:
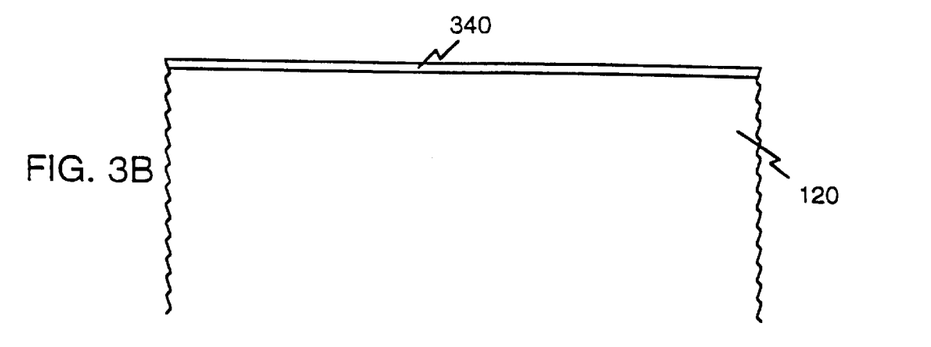
Figure 3C:
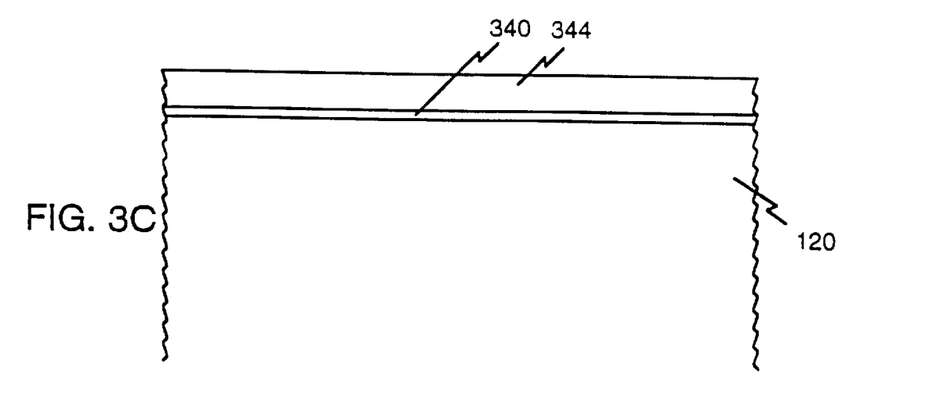
Figure 3D:
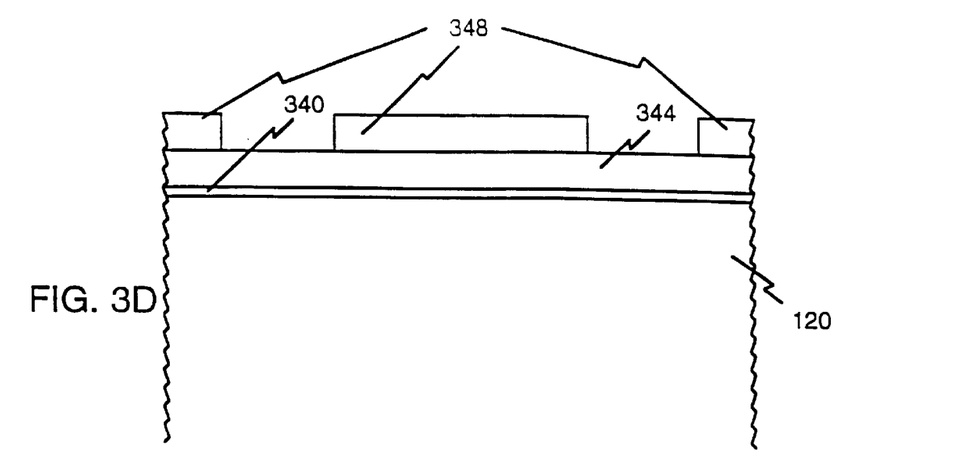
Figure 3E:
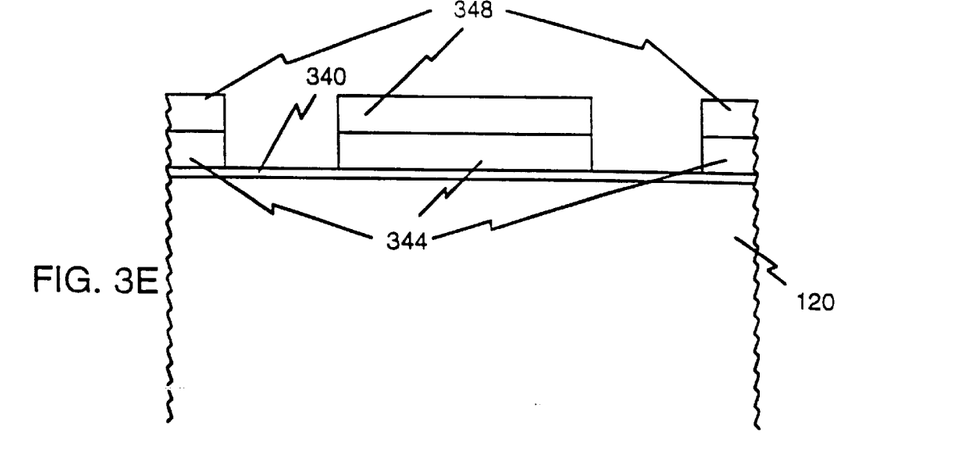
Figure 3F:
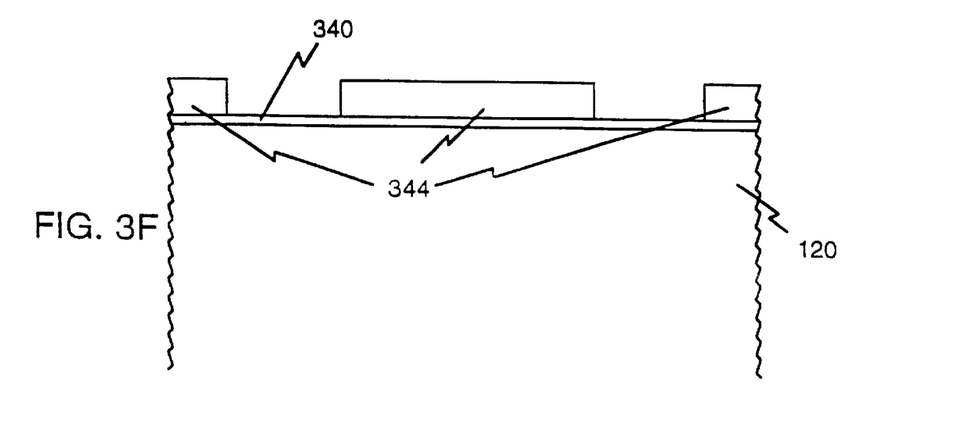
Figure 3G:
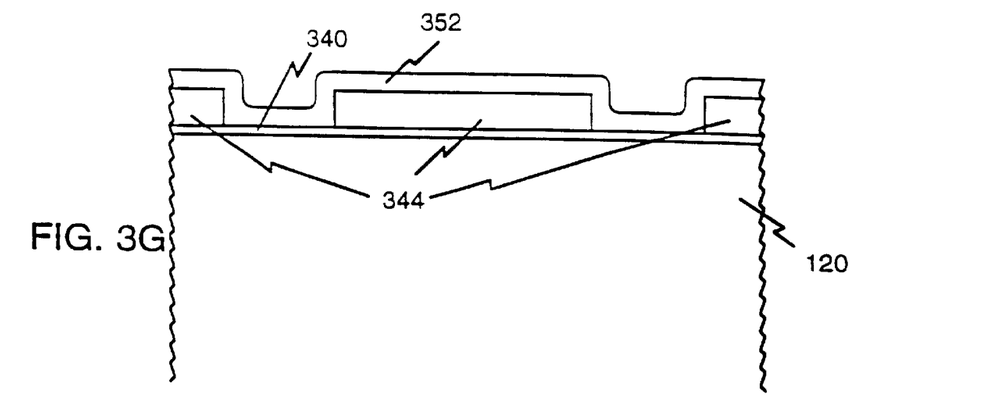
Figure 3H:
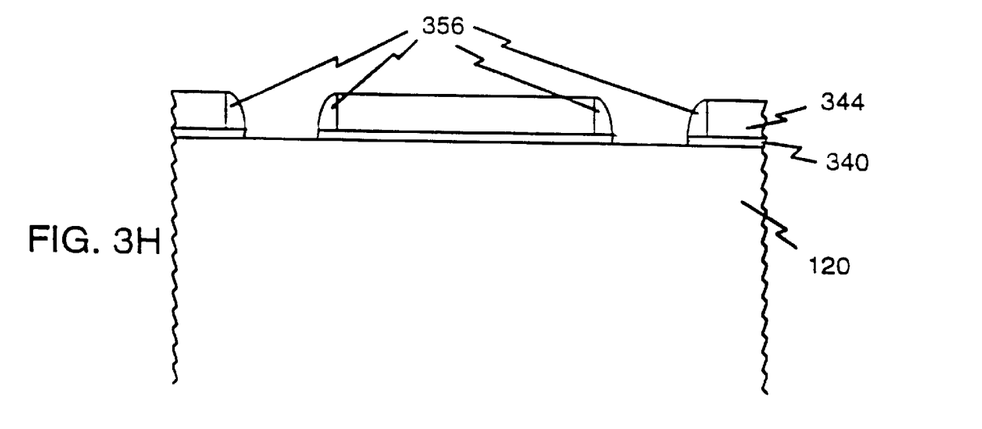
Figure 3I:
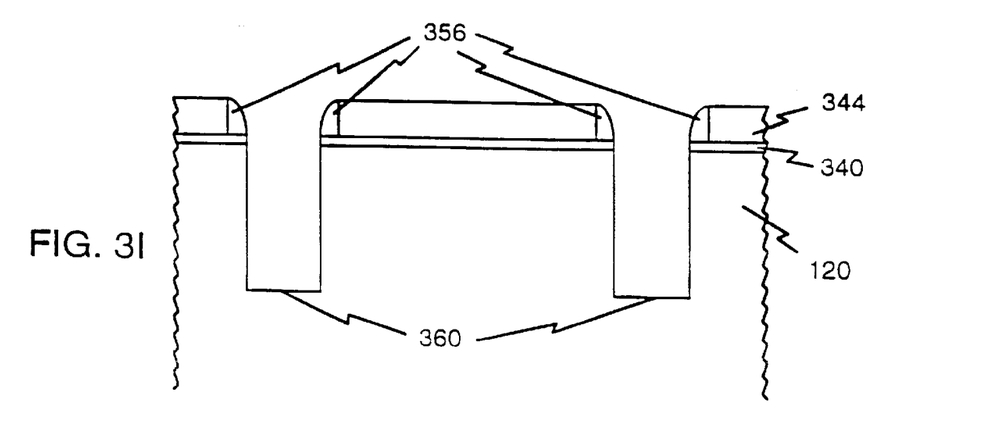
Figure 3J:
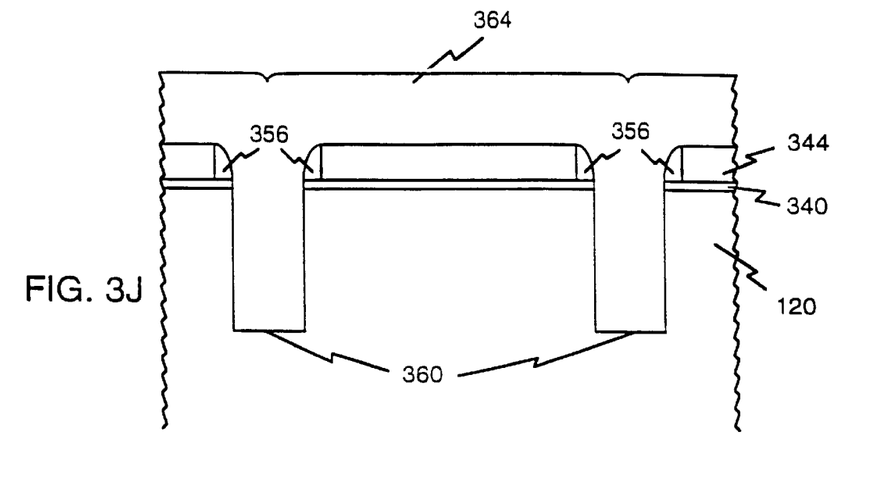
Figure 3K:
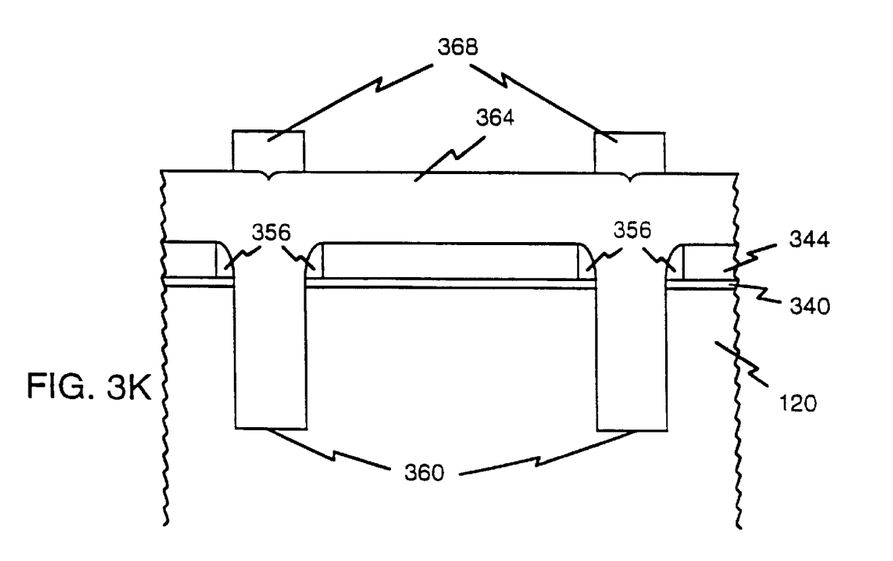
Figure 3L:
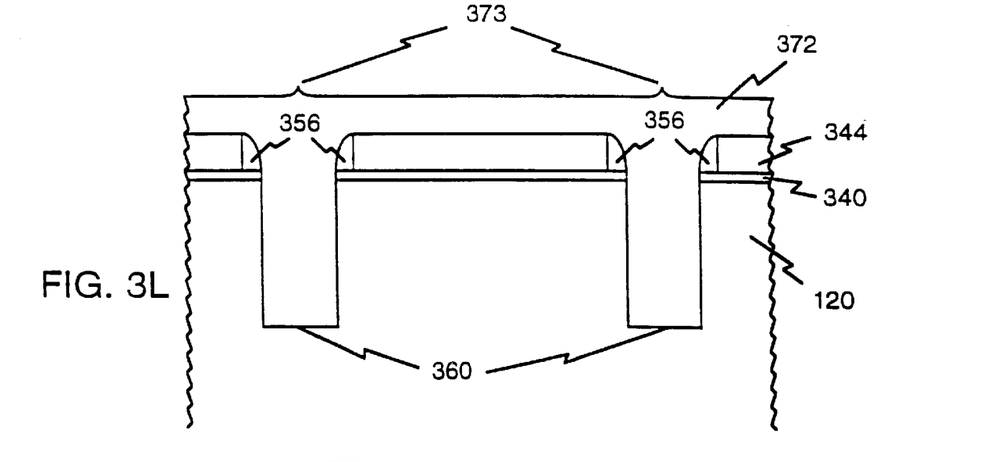
Figure 3M:
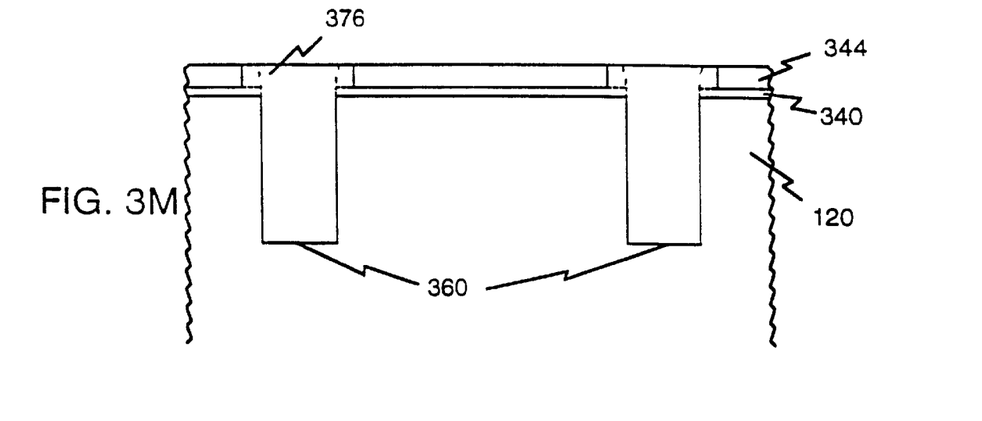
Figure 3N:
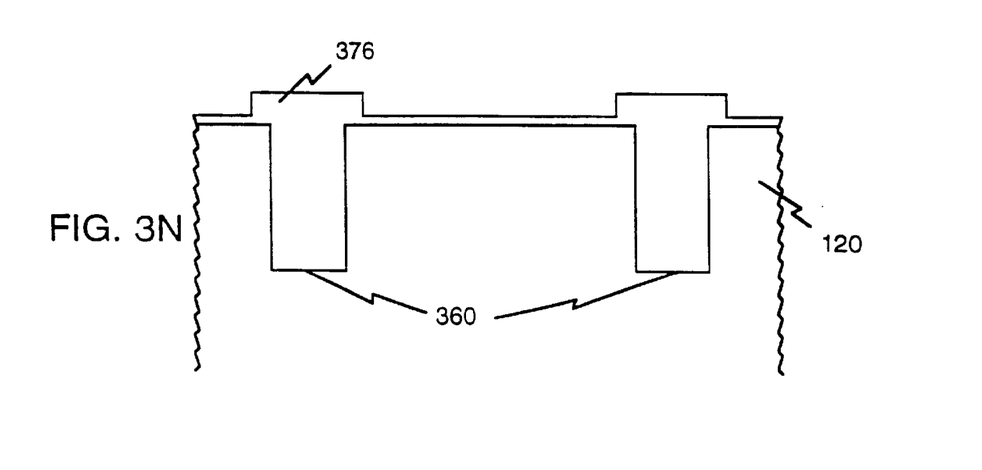
Figure 3O:
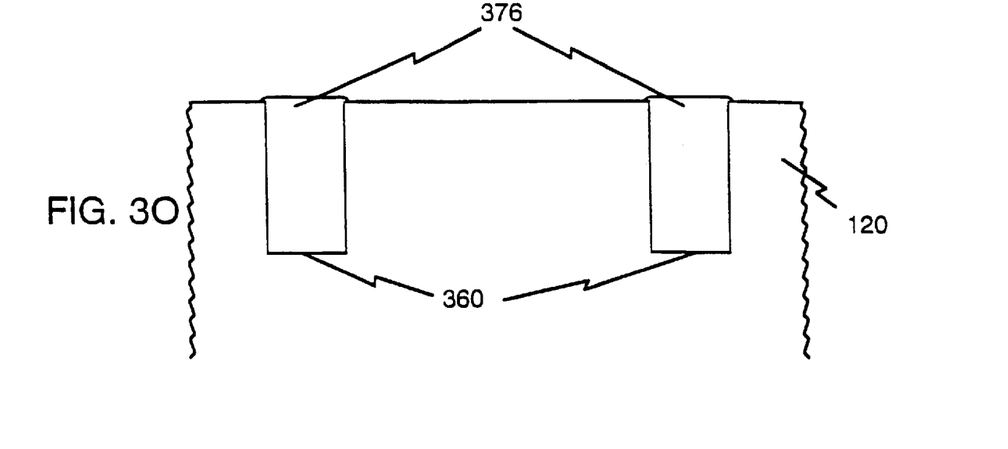
Figure 3P:
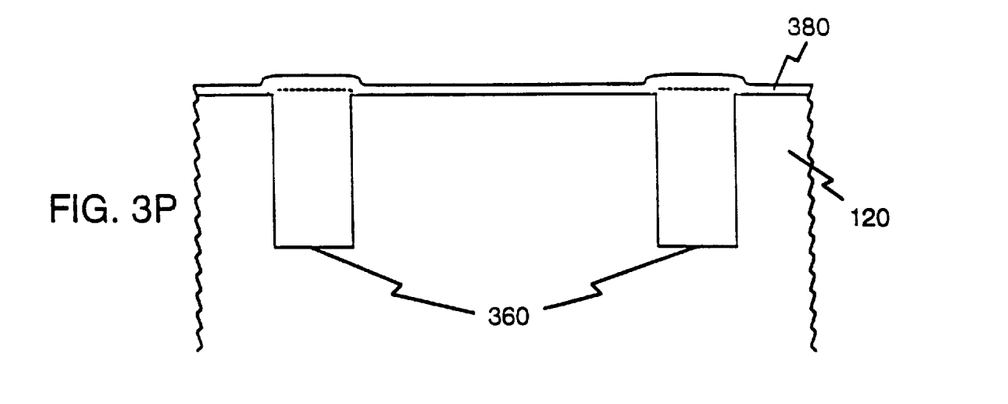
Figure 3Q:
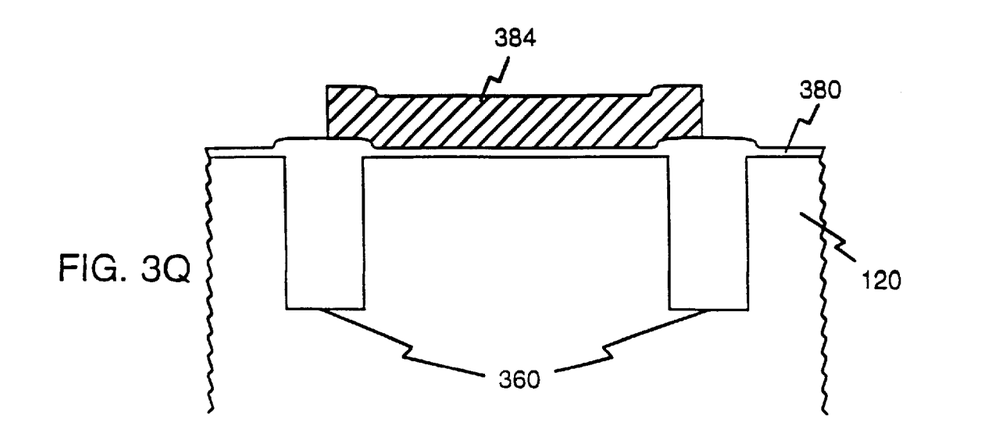

FIGS. 3A–3Q illustrate the preferred steps, according to the invention, for suppressing the formation of parasitic edge transistors and preventing the thinning of gate oxide in an integrated circuit device, such as the device illustrated in FIG. 2.

The substrate 120 is initially provided as shown in FIG. 3A. The substrate 120 is preferably silicon (Si). The surface of the substrate 120 is cleaned, and a 10–60 nm pad oxide 340, preferably silicon oxide ($SiO_2$), is thermally grown on the surface of the substrate as shown in FIG. 3B.

Alternatively, a CVD silicon oxide may be used in place of the thermally-grown pad oxide. An advantage of CVD silicon oxide is that it can be about 25% as thick as a thermally-grown pad oxide. Also, a pad oxide containing a thin thermally-grown silicon oxide layer and a buffer polysilicon layer may be used for the pad oxide 340.

Next, a 100–200 nm thick layer of CVD silicon nitride ($Si_3N_4$) 344 is deposited on top of the pad oxide 340 as shown in FIG. 3C. The pad oxide 340 functions as a buffer layer to cushion the transition of stresses between the substrate 120 and the silicon nitride 344. The silicon nitride 344 functions as an oxidation mask. Silicon nitride is effective in this role because oxygen and water vapor diffuse slowly through it, preventing oxidizing species from reaching the silicon surface under the nitride.

As shown in FIG. 3D, a resist mask 348 is deposited on top of the silicon nitride 344. The resist mask 348 may be a photo-resist mask defined by optical exposure or, alternatively, e-beams or x-rays may be used for the exposure. The apertures or openings in the resist mask define regions which are wider than field regions for subsequent formation of isolation trenches. The areas of the silicon nitride 344 exposed through the resist mask 348 are anisotropically dry etched as shown in FIG. 3E. The resist mask is removed as shown in FIG. 3F.

Next, a CVD oxide 352 is deposited over the entire wafer as shown in FIG. 3G. The CVD oxide 352 is then anisotropically etched to form oxide spacers 356. The regions between the oxide spacers 356 defines the regions for formation of the respective isolation trenches. As shown in FIG. 3I, a dry anisotropic silicon etch is applied to form trenches 360 of a desired depth. The etching gas used for dry anisotropic etch has a greater selectivity for silicon than silicon oxide. Alternatively, the trenches may be formed by sputter etching or ion milling.

The following steps describe the trench filling and planarization procedures. First, a thick oxide layer 364 is deposited to fill the trenches 360 and cover the entire wafer as shown in FIG. 3J. Alternative insulating materials, such as polyimide and porous silicon, may also be used to fill the trenches. Next, in FIG. 3K, a reverse resist mask 368 is deposited over the defined trench regions. This is followed a wet or dry oxide etch which leaves an oxide layer 372 having oxide ridges 373 as shown in FIG. 3L. Finally, the upper surface of the oxide layer 372, along with the oxide ridges 373, is polished by chemical/mechanical polishing (CMP). A conventional CMP process is described in Silicon Processing for the VLSI Era, Volumes I, II, and III, by S. Wolf and R. N. Tauber (Lattice Press 1986). The polishing would stop sometime after the silicon nitride 344 is exposed above the pad oxide 340 as shown in FIG. 3M.

FIG. 3M shows the trenches 360 overfilled with an oxide 376. The overfilled oxide 376 includes portions of the pad oxide 340, the oxide spacers 356 and the thick oxide layer 364. The portion represented by the pad oxide 340 and the oxide spacers 356 are shown with dashed lines because, while added at distinct times, they are part of the overfilled oxide 376. As is shown in FIG. 3N, when the silicon nitride is removed by etch, the pad oxide serves as an etch stop and the overfilled oxide 376 remains.

Next, in FIG. 3O, the pad oxide in the active region is etched such that it is substantially removed from the surface of the substrate 120. However, in the areas of the trenches 360, oxide humps 376 remain with a top level above the planar surface of the substrate 120. Portions of the oxide humps 376 cover the edges and corners of the trenches 360. In FIG. 3P, a gate oxide 380 is grown over the surface of the substrate 120 and covers the oxide humps 376. The gate oxide 380 has a thickness at the edges and corners of the trenches 360 and over the trenches 360 which is greater than its thickness over other areas of the surface of the substrate 120.

Finally, in FIG. 3Q, a gate polysilicon (poly) electrode 384 is deposited on the gate oxide 380. As is shown in FIG. 3Q, the gate poly electrode 384 is positioned between the trenches 360 with a portion of each end of gate poly electrode 384 extending past the trench edges and corners and over the trenches 360.

While particular embodiments according to the invention have been illustrated and described above, it will be clear to one of ordinary skill in the art that the invention can take a variety of forms and embodiments within the scope of the appended claims.

What is claimed is:

1. In an integrated circuit device disposed in a semiconductor body having a planar surface comprising:

an isolating trench with a length and a width disposed in the semiconductor body having a bottom and side walls and containing an insulating material extending from the bottom of the trench to a top level and including an insulating spacer at each of the outside edges of the side walls, said side walls of the trench being in physical contact with the body from the bottom of the trench to the planar surface of the body, said insulating spacers each having a width substantially less than said trench width, the top level and the spacers having a thickness above the planar surface;

a field effect transistor (FET) disposed at the surface of and in the semiconductor body with a gate having a length, and a gate insulator having a thickness and with a lower surface in and on the semiconductor body and an upper surface in contact with a lower surface of the gate, said FET being positioned adjacent the isolating trench with the gate length and the gate insulator extending substantially perpendicular to the trench, an end of the gate length being over the spacer and top level of the insulating material of the trench and the respective end of the gate insulator abutting the spacer of the insulating material of the trench, the thickness of the top level and spacer of the insulating material of the trench being sufficiently greater than the thickness of the gate insulator to suppress corner or edge parasitic transistor formation at the edge of the trench but being sufficiently thin to minimize the effect on planarity above the body surface.

2. The integrated circuit device of claim 1 wherein the FETs include active regions and the spacers are disposed over the active regions.

3. The integrated circuit device of claim 1 wherein the FETs include active regions and the side walls of each of the isolating trenches are in contact with one of the active regions.

4. In an integrated circuit device disposed in a semiconductor substrate having a planar surface comprising:

a field effect transistor (FET) disposed at the surface of and in the semiconductor body having a gate of a length, and a gate insulator having a thickness and with a lower surface in and on the semiconductor substrate and an upper surface in contact with a lower surface of the gate; and an isolating trench with a length and a width disposed in the semiconductor body having a bottom and side walls and containing an insulating material extending from the bottom of the trench to a top level above the planar surface and including insulating spacers at the outside edges of the side walls at the substantially the same level as the top level, said side walls of the trench being in physical contact with the body from the bottom of the trench to the planar surface of the body, said insulating spacers each having a width substantially less than said trench width, said isolating trench being positioned adjacent the FET with the gate length and the gate insulator extending substantially perpendicular to the trench and the gate end over the top level and one of the spacers of the insulating material, said one spacer having an edge abutting the respective end of the gate insulator, the isolating trench having a top level and spacer thickness sufficiently greater than the thickness of the gate insulator so that, with the gate over the top level and spacer, corner or edge parasitic transistor formation is suppressed at the edge of the insulating trench but the thickness of the top level and spacer is sufficiently thin to minimize the effect on planarity above the silicon body surface.

5. The integrated circuit device of claim 4 wherein the FETs include active regions and the spacers are disposed over the active regions.

6. The integrated circuit device of claim 4 wherein the FETs include active regions and the side walls of each of the isolating trenches are in contact with one of the active regions.

7. An integrated circuit device disposed in a semiconductor body having a planar surface comprising:

a plurality of isolating trenches disposed in the semiconductor body and each having a length and a width, each of said plurality of isolating trenches having a bottom and side walls and each containing an insulating material extending from the bottom of the trench to a top level including insulating spacers on the outside edges of the side walls, said side walls of the trench being in physical contact with the body from the bottom of the trench to the planar surface of the body, said insulating spacers each having a width substantially less than said trench width, the top level and spacers being above the planar surface;

a plurality of field effect transistors (FETs) disposed at the surface of and in the semiconductor body, each of said plurality of FETs with a gate having a length and a gate insulator with a lower surface in and on the semiconductor body and an upper surface in contact with a lower surface of the gate, each of the FETs being positioned between two isolating trenches with the gate length and the gate insulator extending substantially perpendicular to the two trenches, each end of the gate insulator abutting one of the spacers of the respective trench and the gate being over the spacer and top level of the trench, the gate insulator between the two isolating trenches having a thickness less than the thickness of top level and spacers of the insulating material above the planar surface of each of the trenches to suppress corner or edge parasitic transistor formation at each of the trenches but being sufficiently thin to minimize the effect on planarity above the body.

8. The integrated circuit device of claim 1, wherein each of the spacers of said plurality of isolating trenches include corners with said planar surface of said semiconductor body and wherein said gate is elevated at each of said corners with respect to other portions of said gate electrode along the planar surface of said semiconductor body of said body by top levels and spacers of said insulating material.

9. An integrated circuit device comprising:

a semiconductor body having a planar surface and an isolating trench disposed in said semiconductor body at said planar surface, said trench having a bottom and side walls with said side walls being in physical contact with said body from the bottom of the trench to the planar surface of the body, said isolating trench including a corner with said planar surface;

an oxide disposed on said planar surface and in said isolating trench, said oxide having a thickness at said corner greater than a thickness of said oxide in other areas of said planar surface; and a field effect transistor (FET) having an active region and a gate disposed on said oxide over said corner and over a portion of said other areas of said planar surface, said corner being over the active region.

10. The integrated circuit device of claim 9, wherein said oxide at said corner is raised with respect to said oxide at other areas of said planar surface, thereby elevating said gate at said corner.

* * * * *